(12) United States Patent
Kim

(10) Patent No.: US 6,249,483 B1
(45) Date of Patent: Jun. 19, 2001

(54) SEMICONDUCTOR MEMORY DEVICE HAVING A CIRCUIT FOR LATCHING DATA FROM A DATA LINE OF A DATA OUTPUT PATH AND A RELATED DATA LATCHING METHOD

(75) Inventor: Nam-jong Kim, Kyungki-do (JP)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/548,017

(22) Filed: Apr. 12, 2000

(30) Foreign Application Priority Data

Jun. 30, 1999 (KR) .................................................. 99-25818

(51) Int. Cl.[7] .................................................. G11C 11/40
(52) U.S. Cl. ............... 365/233; 365/189.05; 365/230.03; 365/230.08
(58) Field of Search ........................ 365/189.05, 230.03, 365/230.08, 233

(56) References Cited

U.S. PATENT DOCUMENTS 6,172,935 * 1/2001 Wright et al. .................... 365/230.08

* cited by examiner

Primary Examiner—Terrell W. Fears
(74) Attorney, Agent, or Firm—Jones Volentine, L.L.C.

(57) ABSTRACT

A semiconductor memory device is provided, having a circuit for latching data on a data line of a data output path. A related data latching method for the semiconductor memory device is also provided. The synchronous semiconductor memory device includes sense amplifiers for sensing the data of the memory cells, a data output register for latching the data of the memory cells, data lines for connecting the sense amplifiers and the data output register to transmit the sensed data to the data output register, and a data line control circuit for generating a data latch signal that releases the latching of the data on the data line in response to a first rising edge of the clock signal synchronized with a read command, and latches the data on the data line in response to a second rising edge of the clock signal.

9 Claims, 6 Drawing Sheets

SEMICONDUCTOR MEMORY DEVICE HAVING A CIRCUIT FOR LATCHING DATA FROM A DATA LINE OF A DATA OUTPUT PATH AND A RELATED DATA LATCHING METHOD

This application relies for priority upon Korean Patent Application No. 99-25818, filed on Jun. 30, 1999, the contents of which are herein incorporated by reference in their entirety.

BACKGROUND OF THE INVENTION

The present invention relates to a semiconductor memory device. More particularly, the present invention relates to a semiconductor memory device having a circuit for latching data on a data line of a data output path, and a related data latching method for the semiconductor memory device.

In the read operation of general semiconductor memory devices, e.g., synchronous DRAMs, row addresses and column addresses are specified to access a given memory cell. Column address transition is detected by a circuit that provides timing pulses for enabling a data output register after a predetermined delay time. The delay time is necessary for precharging, address decoding, and a sensing or driving operation, and results in it taking a long time to perform a read command. The data latched by the data output register is data of a memory cell selected from a memory cell array block.

A data output path includes sense-amplifiers positioned at the ends of a memory cell array for amplifying the data read from a memory cell. The data amplified by the sense-amplifiers is transmitted to the data output register through a data line. The data output register is positioned near input/output pads of a chip. Since the sense-amplifiers and the data output register are spaced apart from each other, a transmission delay is caused between the valid window of the data read from the memory cell and the time at which the data is latched by the data output register.

Newly read data must be latched after the data previously latched from the memory cell array is stored in the data output register. However, if the data is read later than the timing pulse that enables the data output register and is loaded on the data line with a transmission delay, then the read data may be lost. In other words, since the data output register cannot latch the data during the valid window of the previously read data, the previous data is lost.

The loss of the previous data causes malfunctions of synchronous DRAMs. Therefore, when latching the data on a data line of a data output path leading to the data output register of a synchronous DRAM, the data output register must latch the data without losing of previous data.

SUMMARY OF THE INVENTION

To solve the above problems, it is an objective of the present invention to provide a semiconductor memory device having a circuit for latching data from a data line of a data output path.

It is another objective of the present invention to provide a method for latching data by a data output register of the semiconductor memory device.

Accordingly, to achieve the first objective, a synchronous semiconductor memory device is provided operating in synchronization with a clock signal, The synchronous semiconductor memory device comprises a memory cell block having a plurality of memory cells for outputting data from a selected memory cell to a data line, a data line control circuit for generating a data latch signal for releasing the latching of the data onto the data line in response to a first rising edge of the clock signal, synchronized with a read command, and latching the data on the data line in response to a second rising edge of the clock signal. The data latch signal is preferably activated within the valid window of the data from the selected memory cell.

A synchronous semiconductor memory device operating in synchronization with a clock signal is also provide that comprises a memory cell block having a plurality of memory cells for outputting data from a selected memory cell to a data line, sense amplifiers for sensing the data from the memory cells, a data output register for latching the data from the memory cells, data lines for connecting the sense amplifiers and the data output register for transmitting the sensed data to the data output register, and a data line control circuit for generating a data latch signal for releasing the latching of the data on the data line in response to a first rising edge of the clock signal, synchronized with a read command, and latching the data on the data line in response to a second rising edge of the clock signal.

The data line control circuit may itself comprise a first data line controller for generating a first data line control signal in response to a column select disable signal, a second data line controller for generating a second data line control signal in response to the clock signal and a column address, and a third data line controller activated by the second line control signal and deactivated by the first data line control signal, for generating the data latch signal having a predetermined time interval. The first data line control signal preferably operates to latch the data on the data line and disable the selection of a bit line of the memory cell, and the second data line control signal preferably operates to release the latching of the data on the data line and select a bit line of the memory cell.

The data line control circuit may also comprise a first data line controller for generating a first data line control signal in response to the clock signal and a column address, a second data line controller for generating a second data line control signal in response to the clock signal and the column address, and a third data line controller activated by the second line control signal and deactivated by the first data line control signal, for generating the data latch signal having a predetermined time interval. The first data line control signal preferably operates to latch the data on the data line, the column address is latched at the first falling edge of the clock signal and the first data line control signal is generated at the second rising edge of the clock, and the second data line control signal operates to release the latching of the data on the data line.

The data latch signal is preferably activated within the valid window of the memory cell data.

To achieve the second objective, a method is provided for latching data on a data line in a synchronous semiconductor memory device operating in synchronization with a clock signal, in which the data of a memory cell selected from a memory cell block having a plurality of memory cells is output to a data line. The method comprises generating the clock signal, activating a column select signal for selecting a bit line of the selected memory cell in accordance with a read command synchronized with the first rising edge of the clock signal, loading the bit line data of the selected memory cell on the data line in response to the column select signal, releasing latching of the data on the data line in response to the rising edge of the first clock, deactivating the column select signal in response to the second rising edge of the clock signal, and latching the data on the data line in response to the second rising edge of the clock signal.

According to the present invention, since a data latch signal is activated during the valid window of the data of the data line, the data of the data line of the data output path that leads to the data output register can be latched without a loss of data.

BRIEF DESCRIPTION OF THE DRAWINGS

The above objectives and advantages of the present invention will become more apparent by describing in detail a preferred embodiment thereof with reference to the attached drawings in which.

DESCRIPTION OF THE PREFERRED EMBODIMENTS

Figure 1:
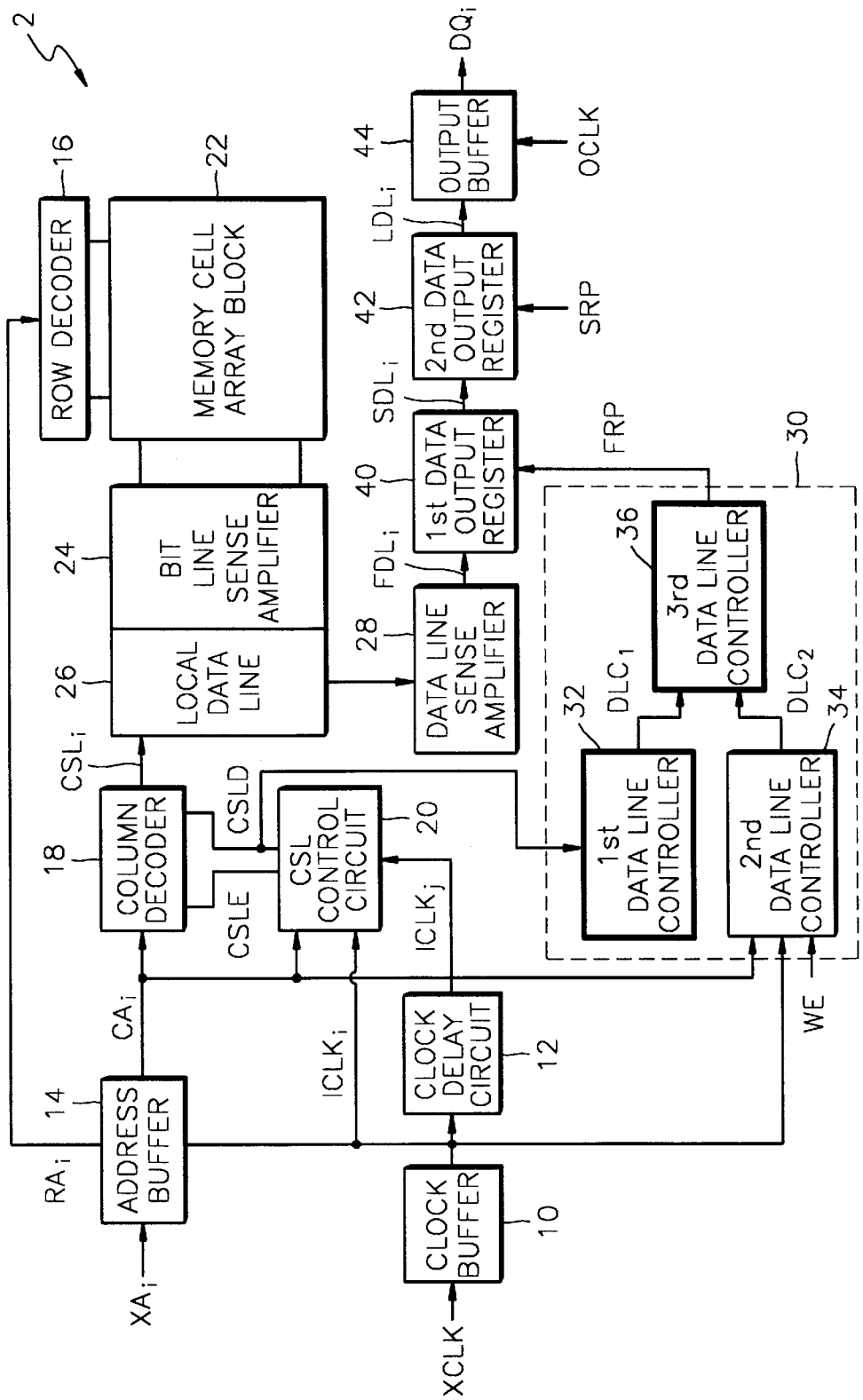
FIG. 1 is a block diagram of a semiconductor memory device according to a preferred embodiment of the present invention.

To fully understand the invention, it's operational advantages, and the objectives accomplished by the invention, preferred embodiments of the present invention will be described below with reference to the accompanying drawings. The same reference numerals in the respective drawings denote the same elements.

In a synchronous DRAM operating in synchronization with a clock signal, the operation of CAS latency 2, in which a data burst of 4 bits from 4 memory cells is output when 2 clock cycles elapse after the application of the read command, will now be described.

First Preferred Embodiment

FIG. 1 illustrates a semiconductor memory device according to a first preferred embodiment of the present invention, in which the valid data window of a data line is established using a data latch signal (FRP). Referring to FIG. 1, a semiconductor memory device 2 includes a clock buffer 10, a clock delay circuit 12, an address buffer 14, a row decoder 16, a column decoder 18, a column select control circuit 20, a bit line sense amplifier 24, and a data line sense amplifier 28.

The clock buffer 10 receives an external clock signal XCLK and generates an internal clock signal $ICLK_i$ acting as a reference clock signal for an internal circuit in the semiconductor memory device. The clock delay circuit 12 generates a delayed clock signal $ICLK_j$, which is delayed by a predetermined amount of time with respect to the internal clock signal $ICLK_i$.

The address buffer 14 receives address signals $XA_i$, and classifies the same into row addresses $RA_i$ and column addresses $CA_i$ in accordance with a row address strobe signal /RAS (not shown) and a column address strobe signal /CAS (not shown). The row decoder 16 decodes the row address $RA_i$ to select a word line (not shown) of a memory cell in a memory cell array block 22. The column select (CSL) control circuit 20 generates a column select enable signal CSLE, which instructs the selection of a bit line (not shown) of the memory cell in the memory cell array block 22. The CSL control circuit 20 also generates a column select disable signal CSLD, which instructs the release of the selection of the bit line in response to the internal clock signal $ICLK_i$, the delayed clock signal $ICLK_j$ and the column addresses $CA_i$.

The column decoder 18 decodes the column addresses $CA_i$ and generates a column select signal $CSL_i$ for selecting a bit line of the memory cell in the memory cell array block 22 in response to the column select enable signal CSLE and the column select disable signal CSLD.

The bit line sense amplifier 24 senses data of memory cells in the memory cell array block 22. The data line sense amplifier 28 senses data of a local data line 26 on which data sensed from the bit line corresponding to the column select signal $CSL_i$ is loaded.

The semiconductor memory device 2 further includes a data line control circuit 30, a first data output register 40, a second data output register 42, and an output buffer 44. The data line control circuit 30 provides a first data latch signal FRP for latching the data on a first data line $FDL_i$. The first data output register 40 transmits the data on the first data line $FDL_i$ to a second data line $SDL_i$ in response to the first data latch signal FRP. The second data output register 42 transmits the data on the second data line $SDL_i$ to the last data line $LDL_i$. The output buffer 44 outputs the data of the last data line $LDL_i$ to a data output pad $DQ_i$ in response to an output clock signal OCLK.

The data line control circuit 30 includes a first data line controller 32, a second data line controller 34, and a third data line controller 36. The first data line controller 32 generates a first data line control signal $DLC_1$ in response to the column select disable signal CSLD. The second data line controller 34 generates a second data line control signal $DLC_2$ in response to the column addresses $CA_i$, the internal clock signal $ICLK_i$ and a write enable signal WE. The third data line controller 36 generates the first data latch signal FRP in response to the first data line control signal $DLC_1$ and the second data line control signal $DLC_2$.

Figure 2:
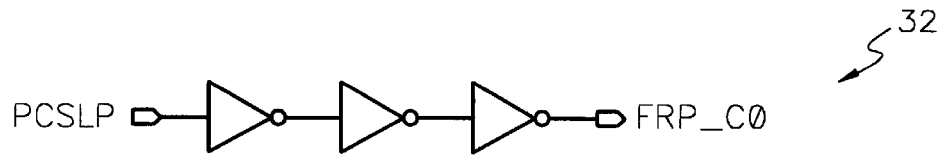
FIG. 2 is a detailed circuit diagram of the first data line controller shown in FIG. 1.

FIG. 2 is a detailed circuit diagram of the first data line controller 32 shown in FIG. 1. Referring to FIG. 2, the first data line controller 32 generates the first data line control signal $DLC_1$ as a logic low ("L") level signal in response to a logic high ("H") level column select disable signal CSLD and generates the first data line control signal $DLC_1$ as an "H" level signal in response to an "L" level column select disable signal CSLD.

Figure 3:
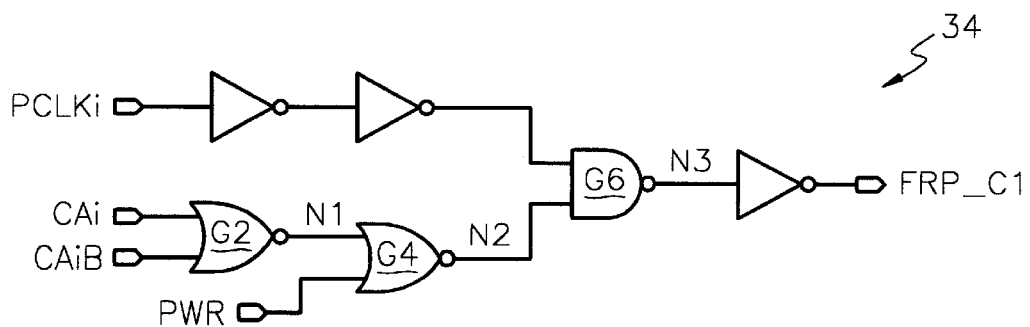
FIG. 3 is a detailed circuit diagram of the second data line controller shown in FIG. 1.

FIG. 3 is a detailed circuit diagram of the second data line controller 34 shown in FIG. 1. Referring to FIG. 3, the second data line controller 34 generates the second data line control signal $DLC_2$ in response to the column addresses CA, the inverted column addresses $/CA_i$, a write enable signal WE, and the internal clock signal $ICLK_i$. The write enable signal WE is enabled during a write operation period in accordance with a write command. A first node $N_1$, which is the output of a 2-input NOR gate $G_2$ goes to an "L" level when one or more of the column address $CA_i$ or inverted column address $/CA_i$ go to an "H" level. A second node $N_2$, which is the output of a 2-input NOR gate $G_4$, goes to an "H" level in response to the "L" level of the first node $N_1$ and an "L" level of the write enable signal WE.

Therefore, in the second data line controller 34, a third node $N_3$, which is the output of a 2-input NAND gate $G_6$ goes to an "L" level at the rising edge of the internal clock signal $ICLK_i$ in a state when the second node $N_2$ is at the "H" level. The "L" level of the third node $N_3$ activates the second data line control signal $DLC_2$ to the "H" level through an inverter $INV_1$. On the other hand, when the second node $N_2$ is at an "H" level, the second data line controller 34 deactivates the second data line control signal $DLC_2$ to an "L" level at the falling edge of the internal clock signal $ICLK_i$.

Figure 4:
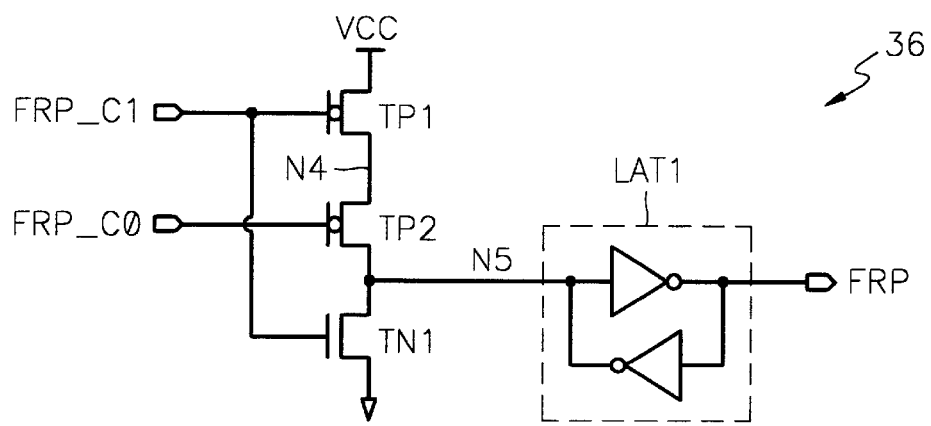
FIG. 4 is a detailed circuit diagram of the third data line controller shown in FIG. 1.

FIG. 4 is a detailed circuit diagram of the third data line controller 36 shown in FIG. 1. Referring to FIG. 4, the third data line controller 36 generates the first data latch signal FRP in response to the first and second data line control signals $DLC_1$ and $DLC_2$. While the first data line control signal $DLC_1$ is at an "H" level, an NMOS transistor $TN_1$ is turned on in response to an "H" level of the second data line control signal $DLC_2$ so that a fifth node $N_5$ goes to an "L" level. When the fifth node $N_5$ goes to the "L" level, it activates the first data latch signal FRP to an "H" level, while maintaining its voltage level with a latch $LAT_1$.

Then, when the second data line control signal $DLC_2$ goes to an "L" level, the NMOS transistor $TN_1$ is turned off but the voltage level of the fifth node $N_5$ of the "L" level is maintained by the latch $LAT_1$. In this case, a PMOS transistor $TP_1$ is turned on in response to the "L" level of the second data line control signal $DLC_2$ so that a fourth node $N_4$ goes to an "H" level. However, since a PMOS transistor $TP_2$ is turned off by the "H" level of the first data line control signal $DLC_1$, the "H" level at the node $N_4$ is not transmitted to the fifth node $N_5$.

Subsequently, in the third data line controller 36, if the first data line control signal $DLC_1$ is changed into an "L" level, the PMOS transistor $TP_2$ is turned on so that the "H" level of the fourth node $N_4$ is transmitted to the fifth node $N_5$. The "H" level of the fifth node $N_5$ then turns the first data latch signal FRP into an "L" level via the latch $LAT_1$.

Figure 5:
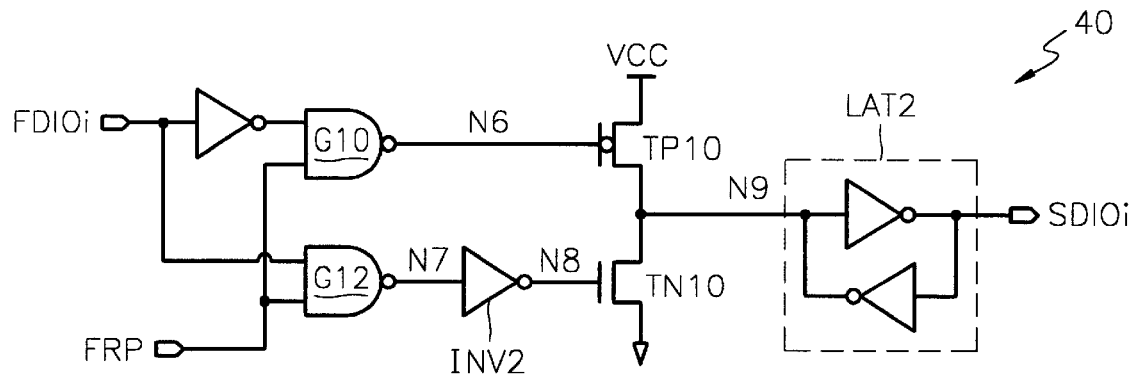
FIG. 5 is a detailed circuit diagram of the first data output register shown in FIG. 1.

FIG. 5 is a detailed circuit diagram of the first data output register 40 shown in FIG. 1. Referring to FIG. 5, the first data output register 40 transmits the data on the first data line $FDL_i$ to the second data line $SDL_i$ in response to the first data latch signal FRP. While the first data latch signal FRP is at the "H" level, a seventh node $N_7$, which is the output of a 2-input NAND gate $G_{12}$, goes to an "L" level in response to an "H" level of the data on the first data line $FDL_i$. When the seventh node $N_7$ changes to the "L" level, an eighth node $N_8$ is activated to the "H" level. Then, an NMOS transistor $TN_{10}$ is turned on in response to the "H" level of the eighth node $N_8$ so that a ninth node $N_9$ goes to an "L" level. The "L" level of the ninth node $N_9$ is then transmitted to the second data line $SDL_i$ by a latch $LAT_2$ so that the data on the second data line $SDL_i$ rises to the "H" level.

Also, in the first data output register 40, while the first data latch signal FRP is at the "H" level, a sixth node $N_6$, which is the output of a 2-input NAND gate $G_{10}$ goes to an "L" level in response to the "L" level of the first data line. A PMOS transistor $TP_{10}$ is then turned on in response to the "L" level of the sixth node $N_6$ so that the ninth node $N_9$ goes to an "H" level. The "H" level of the ninth node $N_9$ is then transmitted to the second data line $SDL_i$ by the latch $LAT_2$ so that the data on the second data line $SDL_i$ falls to an "L" level. As a result, the first data output register 40 transmits the data on the first data line $FDL_i$ to the second data line $SDL_i$ while the first latch signal FRP is at an "H" level.

Figure 6:
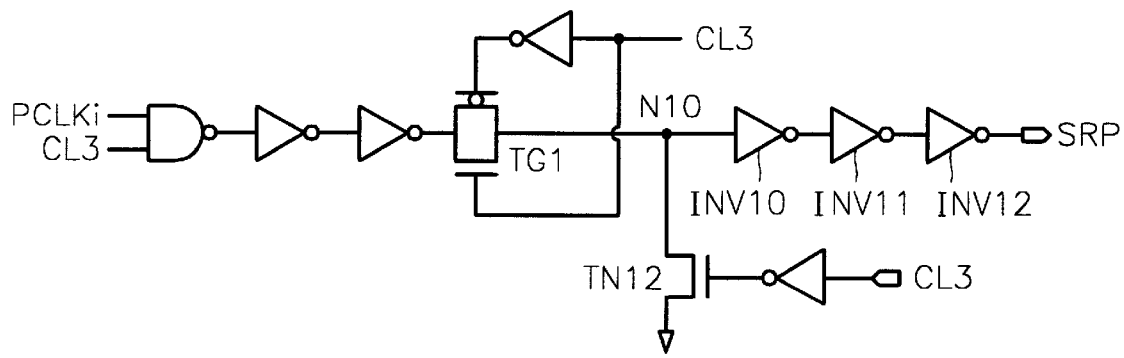
FIG. 6 is a detailed circuit diagram of a circuit for generating a second data latch signal shown in FIG. 1.

FIG. 6 is a diagram of a circuit for generating a second data latch signal SRP for controlling the operation of the second data output register 42 shown in FIG. 1. Referring to FIG. 6, a transistor $TN_{12}$ responsive to a CAS latency mode signal CL of the "L" level is turned on so that a tenth node $N_{10}$ goes to an "L" level. When the tenth node $N_{10}$ goes to the "L" level, it sets the second data latch signal SRP to an "H" level through inverters $INV_{10}$, $INV_{11}$ and $INV_{12}$ in three stages. When the second data latch signal SRP is set to an "H" level, the second data output register 42, to be described later, transmits the data on the second data line $SDL_i$ to the last data line $LDL_i$.

In this embodiment, in order to perform a CAS latency 2 operation in which cell data is output after 2 clock cycles elapse after application of a read command, a mode set register MSR is set to operate the CAS latency 2 and the CAS latency mode signal CL is set to an "L" level. If the CAS latency is set to 3, the CAS latency mode signal CL is set to an "H" level to thus turn on a transfer gate $TG_1$ so that the second data latch signal SRP is generated as pulses in accordance with the internal clock signal $ICLK_i$.

Figure 7:
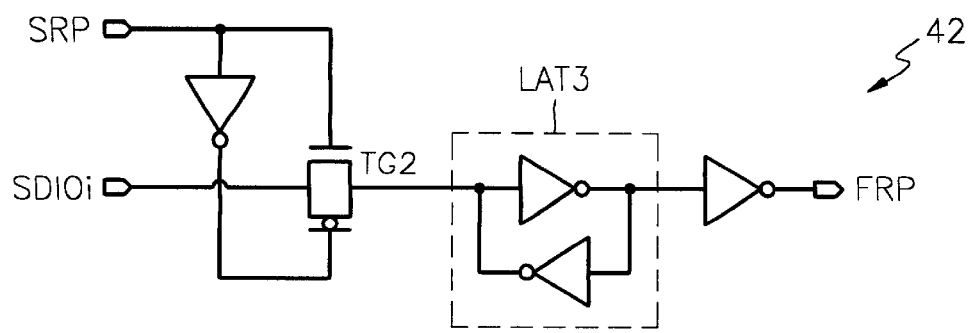
FIG. 7 is a detailed circuit diagram of the second data output register shown in FIG. 1.

FIG. 7 is a detailed diagram of the second data output register 42 shown in FIG. 1. Referring to FIG. 7, the second data output register 42 transmits the data on the second data line $SDL_i$ to the last data line $LDL_i$ through a transfer gate $TG_2$ responsive to the second data latch signal SRP going to an "H" level.

Referring back to FIG. 1, the data on the last data line $LDL_i$ is then output to a data output pad $DQ_i$ through the output buffer 44, which is responsive to the output clock signal OCLK.

The operation of the semiconductor memory device 2 having the data line control circuit 30 according to the present invention will now be described with reference to FIG. 8.

First, internal clock signals $ICLK_i$ are sequentially generated in accordance with an external clock signal (XCLK of FIG. 1), which is preferably externally applied. A read command READ is then received in a semiconductor memory device (2 of FIG. 1) in synchronization with the first rising edge of the internal clock signal $ICLK_i$. A column select enable signal CSLE (a) having a predetermined pulse width is then generated in a CSL control circuit (20 of FIG. 1) in response to the first rising edge of the internal clock signal $ICLK_i$, and the column select enable signal CSLE is continuously generated in accordance with the internal clock signal $ICLK_i$. Also, in a second data line controller (34 of FIG. 3), the second data line control signal $DLC_2$ rises to the "H" level in response to the first rising edge of the internal clock signal $ICLK_i$ (b). The column select signal $CSL_i$ (c) is then activated to the "H" level in response to the rising edge of the column select enable signal CSLE.

Thereafter, a column select disable signal CSLD (d) having a predetermined pulse width is generated in the CSL control circuit (20 of FIG. 1) in response to the second rising edge of the internal clock signal $ICLK_i$, and the column select disable signal is continuously generated in accordance with the internal clock signal $ICLK_i$. The column select signal $CSL_i$ is deactivated to an "L" level (e) and the first data line control signal $DLC_1$ in the first data line controller (32 of FIG. 2) falls to the "L" level (f) in response to the "H" level of the column select disable signal CSLD.

Bit line data of a memory cell corresponding to the column select signal $CSL_i$ is loaded on the first data line $FDL_i$ in response to the "H" level of the column select signal $CSL_i$ (g) and (h). In the third data line controller (36 of FIG. 4), the first data latch signal FRP rises to the "H" level (i) in response to the "H" level of the second data line control signal $DLC_2$, and the first data latch signal FRP falls to an "L" level (j) in response to the "L" level of the first data line control signal $DLC_1$. Thus, the first data latch signal FRP has a pulse width of $t_1$. The above-described operational sequence (a) through (j) are repeated four times in accordance with the internal clock signal $ICLK_i$, thereby continuously generating four first data latch signals, i.e., 4 FRPs, which satisfies the assumed burst length 4 rule.

In the first data output register (40 of FIG. 5), the data on the first data line $FDL_i$ is transmitted to the second data line $SDL_i$ (k) in response to the "H" level of the first data latch signal FRP. The data on the first data line $FDL_i$, corresponding to the continuously generated first data latch signals FRPs, is transmitted to the second data line $SDL_i$ (1), (m), and (n) in response to the rising edge of the continuously generated first data latch signals FRPs of an "H" level.

Finally, the data on the second data line $SDL_i$, corresponding to the output clock signal OCLK, is output to the output pad $DQ_i$ in response to the "H" level of the respective output clock signals OCLKs. Since the first effective data on the output pad $DQ_i$ exists after 2 clock cycles of the clock synchronized with the read command READ, the assumed CAS latency 2 rule is satisfied. Also, since three pieces of data are continuously output after the first data is output to the output pad $DQ_i$, the assumed burst length 4 rule is also satisfied.

As described above, according to this first preferred embodiment, since the first data latch signal FRP is activated within the valid window of data on the first data line $FDL_i$, the data on the first data line $FDL_i$ of the data output path, which leads to the data output registers (40 and 42 of FIG. 1), can be latched without data loss.

Second Preferred Embodiment

Figure 9:
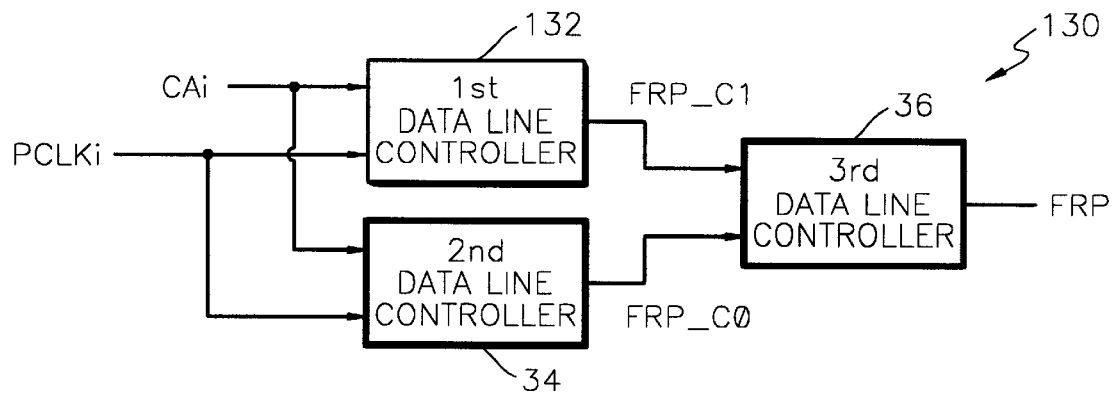
FIG. 9 is a detailed circuit diagram illustrating an example of an alternative data line control circuit to that shown in FIG. 1 according to a second preferred embodiment of the present invention.

FIG. 9 is a detailed circuit diagram illustrating an example of an alternative data line control circuit 1 to the data line control circuit 30 shown in FIG. 1. Referring to FIG. 9, the operation of the alternative data line control circuit 130 is substantially the same as that of the data line control circuit 30 shown in FIG. 1, and includes a first data line controller 132, a second data line controller 34 and a third data line controller 36.

The second and third data line controllers 34 and 36 correspond to those in FIG. 1. The first data line controller 132 generates a first data line control signal $DLC_i$ in response to column addresses $CA_i$ and the internal clock signal $ICLK_i$, just like the second data line controller 34. In contrast, the first data line controller 32 shown in FIG. 1 generates a first data line control signal $DLC_1$ in response to a column select disable signal CSLD. The first data line controller 132 is shown in detail in FIG. 10.

Figure 10:
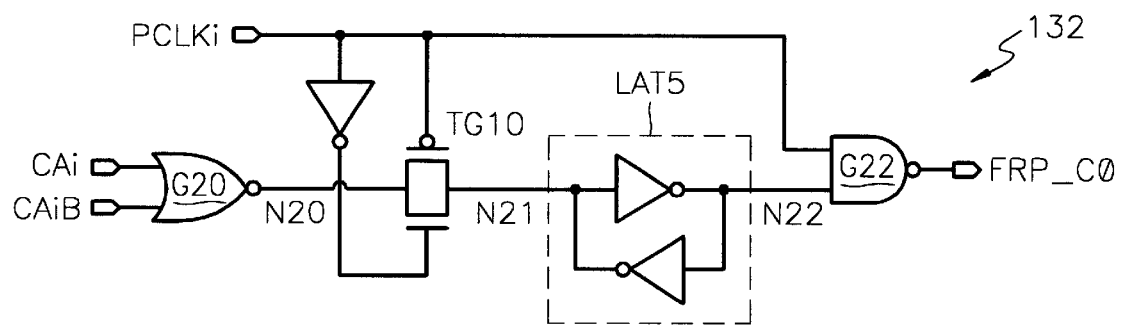
FIG. 10 is a detailed circuit diagram of the first data line controller shown in FIG. 9.

Referring to FIG. 10, in the first data line controller 132, a twentieth node $N_{20}$ which is the output of a 2-input NOR gate $G_{20}$ goes to an "L" level in response to any column address $CA_i$ or complementary column address $/CA_i$, and generates a column select signal $CSL_i$ for selecting a bit line of a memory cell. The "L" level of the twentieth node $N_{20}$ is transmitted to a twenty-first node $N_{21}$ through a transfer gate $TG_{10}$ responsive to the "L" level of the internal clock signal $ICLK_i$. The "L" level of the twenty-first node $N_{21}$ maintains its voltage level by a latch $LAT_5$ and activates a twenty-second node $N_{22}$ to an "H" level. In this case, a 2-input NAND gate $G_{22}$ sets its output, i.e., the first data line control signal $DLC_1$, to an "H" level in response to a falling edge of the internal clock signal $ICLK_i$.

Thereafter, the transfer gate $TG_{10}$ is turned off in response to a rising edge of the internal clock signal $ICLK_i$. However, the "L" level of the twenty-first node $N_{21}$ and the "H" level of the twenty-second node $N_{22}$ maintain their voltage levels through the latch $LAT_5$. Thus, the first data line control signal $DLC_i$, which is the output of the 2-input NAND gate $G_{22}$, is activated to an "L" level in response to the "H" level of the twenty-second node $N_{22}$ and the rising edge of the internal clock signal $ICLK_i$.

Therefore, the first data line controller 132 latches a column address at a first falling edge of the internal clock signal $ICLK_i$, and generates the first data line control signal $DLC_1$, which is at an "L" level, at the second rising edge of the internal clock signal $ICLK_i$. Thus, the first data line control signal $DLC_1$ has a predetermined pulse width of an "L" level during the second period of the internal clock signal $ICLK_i$, as shown in FIG. 8, and is synchronously generated in accordance with the internal clock signal $ICLK_i$. Therefore, the first data line control signal $DLC_1$ generated in the first data line controller 132 is produced with the same timing as that shown in FIG. 8.

In other words, when the alternative first data line controller 132 of the second preferred embodiment replaces the first data line controller 32 shown in FIG. 1, the first data latch signal FRP is activated within the valid window of the data on the first data line $FDL_i$, just as in the first preferred embodiment. Therefore, the data on the first data line $FDL_i$ of the data output path led to the data output registers (40 and 42 of FIG. 1) can be latched without data loss.

COMPARATIVE EXAMPLE

Figure 11:
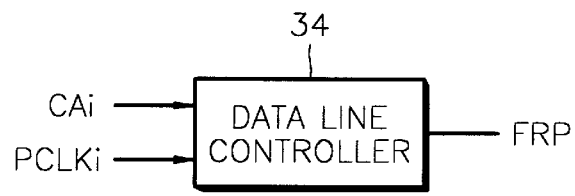
FIG. 11 is a diagram illustrating a comparative example of the data line control circuits shown in FIGS. 1 and 9.

FIG. 11 is a diagram illustrating a comparative example of the data line control circuits 30 and 130 shown in FIGS. 1 and 9. Referring to FIG. 11, the data line controller 230 according to this comparative example corresponds to the second data line controller 34 shown in FIG. 3.

As described in FIG. 3, in the second data line controller 34, the second data line control signal $DLC_2$ rises to an "H" level in response to the rising edge of the internal clock signal $ICLK_i$ with respect to the write enable signal WE of an "L" level and a column address $CA_i$ of an "H" level. Also, the second data line control signal $DLC_2$ falls to an "L" level in response to the falling edge of the internal clock signal $ICLK_i$. In this comparative example, the second data line control signal $DLC_2$ corresponds to the data latch signal FRP. Therefore, the data latch signal FRP is produced as pulses having an "H" level period during cycles of the internal clock signal $ICLK_i$. The operation of enabling the data output register using the data latch signal will be described with reference to FIGS. 1 and 12.

Figure 8:
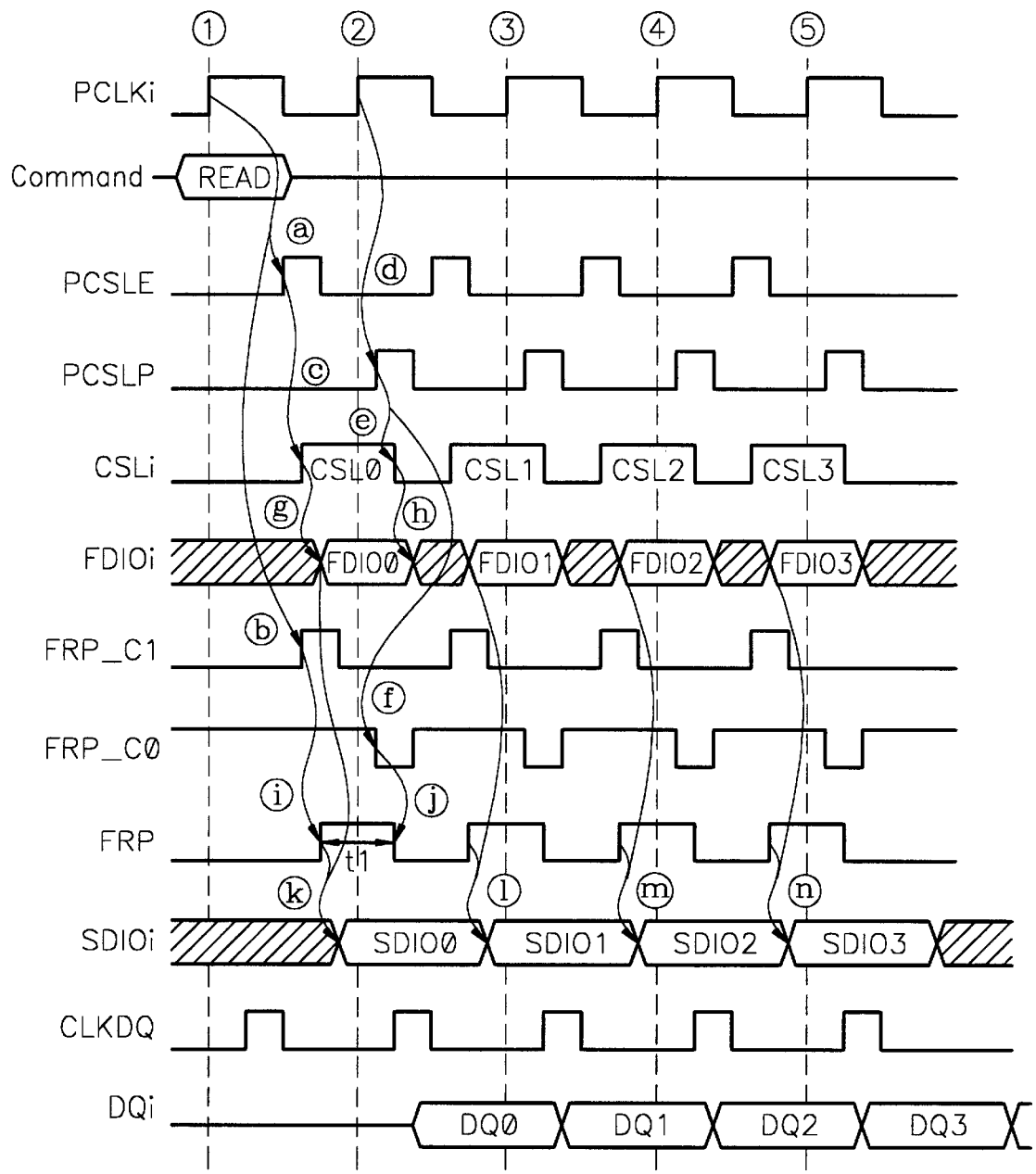
FIG. 8 is a timing diagram illustrating the operation of the semiconductor memory device shown in FIG. 1.
Figure 12:
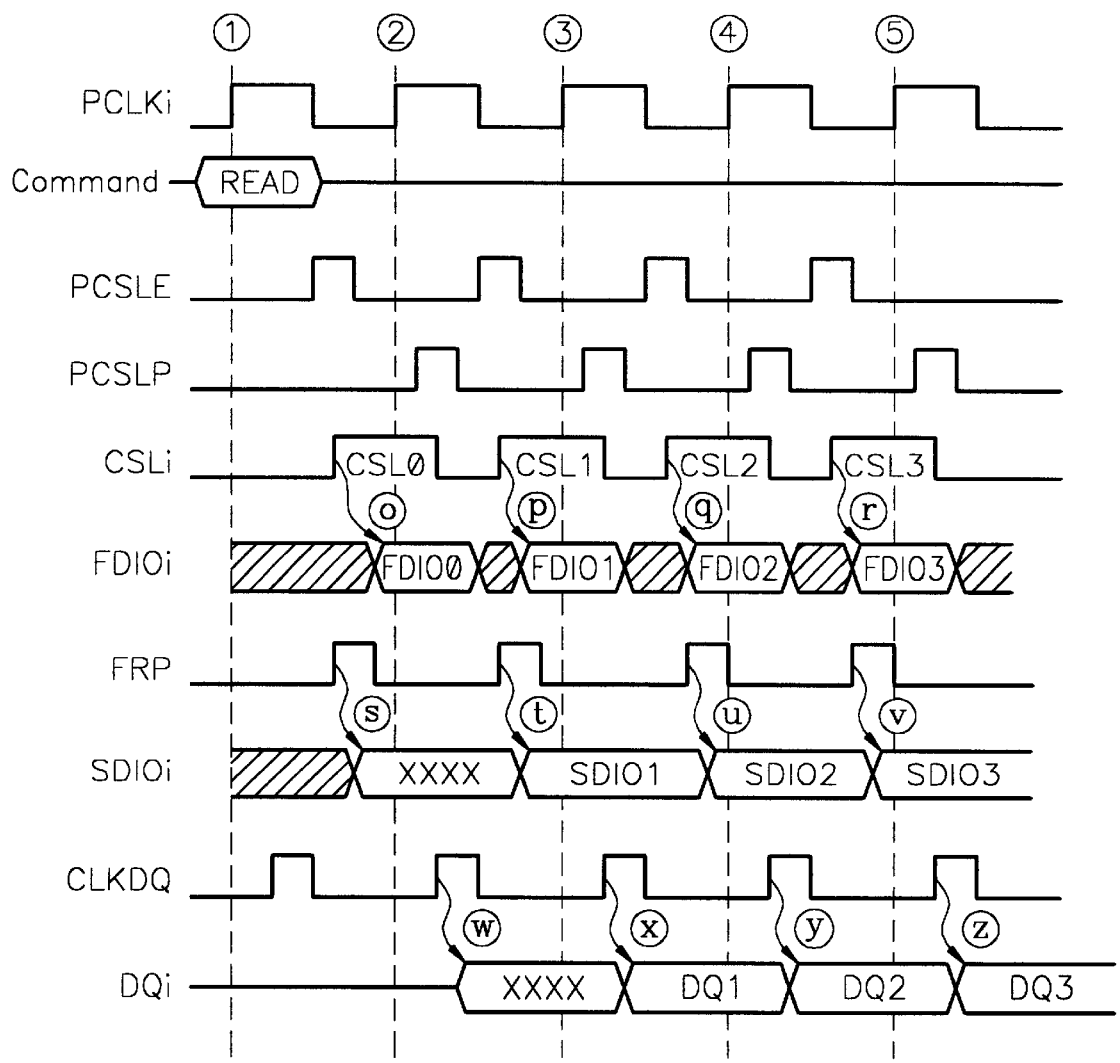
FIG. 12 is a timing diagram illustrating the operation of a semiconductor memory device having the data line control circuit shown in FIG. 11.

Referring to FIG. 12, the operations (a) through (e) are performed in the same manner as that shown in FIG. 8. The data latch signal FRP is the same as the second data line control signal $DLC_2$ shown in FIG. 8. The data of a memory cell in the memory cell array corresponding to the column select signal $CSL_i$ is loaded on the first data line $FDL_i$. For example, if the memory cell corresponding to the first column select signal $CSL_0$ is far from the first data line $FDL_i$, the data of the memory cell corresponding to the first pulse of the column select signal $CSL_0$ is loaded on the first data line $FDL_i$ after a delay time with respect to the activation of the first column select signal $CSL_0$ to the "H" level (o).

The data of the memory cells corresponding to the second through fourth pulses of the column select signal $CSL_1$ through $CSL_3$ are loaded on the first data line $FDL_i$ with the delay time in accordance with the corresponding column select signals $CSL_i$ through $CSL_3$ (p), (q), and (r). Thereafter, the first data output register (40 of FIG. 1) latches the data on the first data line $FDL_i$ in response to the first data latch signal FRP.

Since the first data latch signal FRP is activated and then deactivated before the first memory cell data is loaded on the first data line $FDL_i$, the data of the memory cell corresponding to the first pulse of the column select signal $CSL_0$ is not loaded on the first data line $FDL_i$. The first data output register (40 of FIG. 1) latches invalid data (s) and the data $FDL_0$ of the memory cell corresponding to the first column select signal $CSL_0$ is lost. The invalid data is transmitted to the second data line $SDL_i$, which is the output of the first data output register (40 of FIG. 1). The invalid data on the second data line $SDL_i$ is then output to the output pad $DQ_i$ in response to the output clock signal OCLK through the second output register (42 of FIG. 1) and the output buffer (44 of FIG. 1) (w).

Since the data latch signal FRP of the comparative example is not activated within the valid data window of the memory cell data on the first data line $FDL_0$, the memory cell data on the first data line $FDL_0$ is lost. In contrast, the data latch signals of the first and second preferred embodiments are activated within the valid window of the memory cell data, the data of the memory cell on the first data line $FDL_i$ can be latched in a stable manner without data loss.

Also, the memory cell data $FDL_1$ through $FDL_3$ corresponding to the second through fourth pulses of the column select signal $CSL_1$ through $CSL_3$ are transmitted to the second data line $SDL_i$ (t), (u), and (v) in accordance with the activation of the data latch signal FRP, and are output to the output pad $DQ_i$ in response to the output clock signal OCLK (x), (y), and (z). However, if the memory cell data $FDL_1$ through $FDL_3$, corresponding to the second through fourth pulses of the column select signals $CSL_1$ through $CSL_3$, are also loaded on the first data line $FDL_i$ after a rather long delay time, like the memory cell data $FDL_0$ corresponding to the first column pulse of the select signal $CSL_0$, the data latch signal FRP is not activated within the valid window of the memory cell data $FDL_1$ through $FDL_3$ so that the memory cell data $FDL_1$ through $FDL_3$ may also be lost.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A synchronous semiconductor memory device operating in synchronization with a clock signal, comprising:
   a memory cell block having a plurality of memory cells for outputting data from a selected memory cell to a data line;
   a data line control circuit for generating a data latch signal for releasing the latching of the data onto the data line in response to a first rising edge of the clock signal, synchronized with a read command, and latching the data on the data line in response to a second rising edge of the clock signal.

2. A synchronous semiconductor memory device, as recited in claim 1, wherein the data latch signal is activated within the valid window of the data from the selected memory cell.

3. A synchronous semiconductor memory device operating in synchronization with a clock signal, comprising:
   a memory cell block having a plurality of memory cells for outputting data from a selected memory cell to a data line;
   sense amplifiers for sensing the data from the memory cells;
   a data output register for latching the data from the memory cells;
   data lines for connecting the sense amplifiers and the data output register for transmitting the sensed data to the data output register; and
   a data line control circuit for generating a data latch signal for releasing the latching of the data on the data line in response to a first rising edge of the clock signal, synchronized with a read command, and latching the data on the data line in response to a second rising edge of the clock signal.

4. A synchronous semiconductor memory device, as recited in claim 3, wherein the data line control circuit comprises:
   a first data line controller for generating a first data line control signal in response to a column select disable signal;
   a second data line controller for generating a second data line control signal in response to the clock signal and a column address; and
   a third data line controller activated by the second line control signal and deactivated by the first data line control signal, for generating the data latch signal having a predetermined time interval.

5. A synchronous semiconductor memory device, as recited in claim 4,
   wherein the first data line control signal operates to latch the data on the data line and disable the selection of a bit line of the memory cell, and
   wherein the second data line control signal operates to release the latching of the data on the data line and select a bit line of the memory cell.

6. A synchronous semiconductor memory device, as recited in claim 3, wherein the data line control circuit comprises:
   a first data line controller for generating a first data line control signal in response to the clock signal and a column address;
   a second data line controller for generating a second data line control signal in response to the clock signal and the column address; and
   a third data line controller activated by the second line control signal and deactivated by the first data line control signal, for generating the data latch signal having a predetermined time interval.

7. A synchronous semiconductor memory device, as recited in claim 6,
   wherein the first data line control signal operates to latch the data on the data line, wherein the column address is latched at the first falling edge of the clock signal and the first data line control signal is generated at the second rising edge of the clock, and wherein the second data line control signal operates to release the latching of the data on the data line.

8. A synchronous semiconductor memory device, as recited in claim 3, wherein the data latch signal is activated within the valid window of the memory cell data.

9. A method for latching data on a data line in a synchronous semiconductor memory device operating in synchronization with a clock signal, in which the data of a memory cell selected from a memory cell block having a plurality of memory cells is output to a data line, the method comprising:

generating the clock signal;

activating a column select signal for selecting a bit line of the selected memory cell in accordance with a read command synchronized with the first rising edge of the clock signal;

loading the bit line data of the selected memory cell on the data line in response to the column select signal;

releasing latching of the data on the data line in response to the rising edge of the first clock;

deactivating the column select signal in response to the second rising edge of the clock signal; and latching the data on the data line in response to the second rising edge of the clock signal.

* * * * *